United States Patent [19]

Akita

[11] Patent Number: 4,714,827
[45] Date of Patent: Dec. 22, 1987

[54] PHOTO-ELECTRIC CONVERSION DEVICE WITH DARK CURRENT COMPENSATION

[75] Inventor: Shigeyuki Akita, Okazaki, Japan

[73] Assignee: Nippon Soken, Inc., Nishio, Japan

[21] Appl. No.: 818,606

[22] Filed: Jan. 13, 1986

[30] Foreign Application Priority Data

Jan. 18, 1985 [JP] Japan .................................... 60-8222

[51] Int. Cl.$^4$ ............................................. H01J 40/14
[52] U.S. Cl. ................................. 250/214 C; 307/311
[58] Field of Search ............... 250/214 C, 214 R, 206, 250/209, 349; 307/278, 311; 374/133; 331/65

[56] References Cited

U.S. PATENT DOCUMENTS

| 3,045,125 | 7/1962 | Mason | 250/214 C |
| 4,356,393 | 10/1982 | Fayfield | 250/214 R |

Primary Examiner—David C. Nelms
Assistant Examiner—Chung K. Seo
Attorney, Agent, or Firm—Cushman, Darby & Cushman

[57] ABSTRACT

A photo-electric conversion device includes a first photodiode in which a current is changed in accordance with a light intensity; a second photodiode which is connected to the first photodiode and in which a current flows in the same direction as that in the first photodiode; a light shielding structure for shielding the second photodiode with regard to light; a capacitor, connected in parallel with the second photodiode, for charging/discharging a current from the first photodiode; and an oscillator circuit for performing a switching operation in accordance with the charging/discharging operation of the capacitor so as to generate an oscillation voltage output. The light intensity is thus converted into a frequency of the oscillating voltage, and dark current in the first photodiode is discharged through the second photodiode such that the capacitor is always charged only by a current caused by received light detected by the first photodiode.

7 Claims, 7 Drawing Figures

PHOTO-ELECTRIC CONVERSION DEVICE WITH DARK CURRENT COMPENSATION

BACKGROUND OF THE INVENTION

1. Field of the Invention

The present invention relates to a photoelectric conversion device which converts light intensity (or illuminance) into an oscillation frequency in a digital signal form. The device according to the present invention is used to detect illuminance for discrimating night and day.

2. Description of the Related Art

It has been known that illuminance may be converted into an oscillation frequency by utilizing a photocurrent of a photodiode so as to derive a digital signal. However, in a prior art photo-electric conversion circuit using this known method, the oscillation frequency can vary widely depending on the ambient temperature of the photodiode. In general, in a photodiode a small dark current flows even when no light is radiated thereon. This is because a carrier present at a low energy level is excited by heat energy and is transferred to a conduction band. Therefore, the dark current varies in accordance with the ambient temperature of the photodiode.

In other words, in a conventional photoelectric conversion circuit, since not only a photocurrent but also a dark current, which varies in accordance with ambient temperature, flows into a capacitor for charging/discharging the photocurrent, the charging/discharging time of the capacitor also varies in accordance with the ambient temperature of the photodiode. Thus, the oscillation frequency of the photodiode varies widely.

SUMMARY OF THE INVENTION

It is the object of the present invention to provide a photo-electric conversion device which is improved so that an oscillation frequency does not widely vary in accordance with an ambient temperature of a photodiode.

According to the fundamental aspect of the present invention, there is provided a photo-electric conversion device for detecting a light intensity and converting the detected light intensity into a digital electrical signal, the device including: an oscillation unit for delivering a digital electrical signal when a voltage is applied from a power source; a light sensor unit at a location for receiving a light for delivering a current corresponding to the intensity of the received light; a current stabilizing unit for stabilizing the value of the current delivered from the light sensor unit under a change of the ambient temperature of the light sensor unit; and a frequency changing unit for changing the frequency of the oscillation unit according to the change of the current delivered from the light sensor unit.

According to another aspect of the present invention, there is provided a photo-electric conversion device including a first photodiode in which a current is changed in accordance with light intensity; a second photodiode connected to the first photodiode for passing a current in the same direction as that in the first photodiode; light shielding structure for shielding the second photodiode with regard to light; a capacitor, connected in parallel with the second photodiode, for charging/discharging a current from the first photodiode; and an oscillator circuit for performing a switching operation in accordance with a charging/discharging operation of the capacitor so as to generate an oscillation voltage output, whereby the light intensity is converted into a frequency of the oscillation voltage.

In the photo-electric conversion device according to the present invention, a dark current generated in the first photodiode flows through the second photodiode and is not charged on the capacitor. The time required for charging/discharging the capacitor is not influenced by the level of the dark current and, therefore, is not influenced by ambient temperature. The time required is determined only by a current generated in the first photodiode.

DESCRIPTION OF THE PREFERRED EMBODIMENTS

Figure 1:
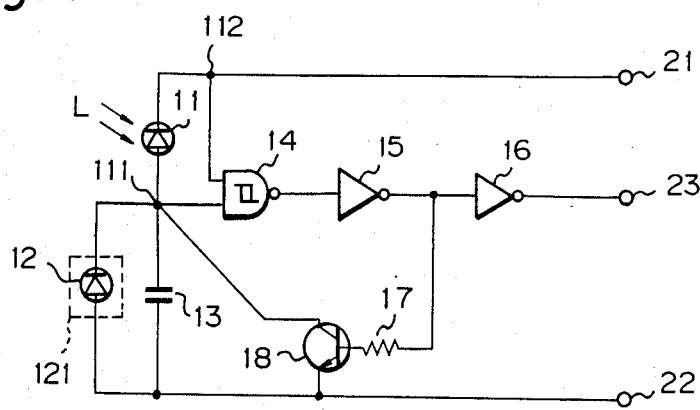
FIG. 1 is a circuit diagram showing a photo-electric conversion device according to an embodiment of the present invention.

FIG. 1 shows a photo-electric conversion device according to an embodiment of the present invention. In the device shown in FIG. 1, reference numeral 11 denotes a first photodiode for detecting light (L), and reference numeral 12 denotes a second photodiode covered with a shielding means, e.g., a light shielding tape 121 so as to allow only a dark current to flow therethrough. The same type of photodiode as used in the photodiode 11 is used for the photodiode 12 so that the dark current from the photodiode 11 can flow as smoothly as possible, and a photocurrent can be shielded therefrom. In this case, the dark current of the photodiode 12 is preferably slightly higher than that of the photodiode 11.

Referring to FIG. 1, reference numeral 13 denotes a capacitor, and reference numeral 14 denotes a 2-input NAND gate having a Schmitt trigger function. The NAND gate 14 has different circuit threshold voltages for the leading and trailing edges of an input waveform. For the 2-input NAND gate 14, an IC TC4093BP available from TOSHIBA CORP. can be used. Reference numerals 15 and 16 denote inverter gates, whereas reference numeral 17 denotes a resistor and an NPN transistor. Reference numerals 21 and 22 denote positive and negative power source terminals, respectively. The NAND gate 14 having the Schmitt trigger function (referred to as the NAND gate 14 hereinafter) and the inverter gates 15 and 16 are connected to a power source (not shown). Finally, reference numeral 23 denotes an output terminal at which an oscillation signal appears.

The operation of the device shown in FIG. 1 will be described hereinafter. First, when a voltage is applied across power source terminals 21 and 22, a voltage appearing at an input terminal 112 of the NAND gate 14 is a power source HIGH ("1") level voltage. When light becomes incident on the first photodiode 11, a photocurrent flows from the cathode to the anode of the photodiode 11, and the capacitor 13 begins to charge. For this reason, the voltage at an input terminal 111 of the NAND gate 14 begins to increase from LOW ("0") level. When the voltage at the terminal 111 exceeds the threshold voltage of the NAND gate 14, the output from the NAND gate 14 goes from "1" to "0".

Since this "0" voltage is supplied to the input of the inverter gate 15, the output from the gate 15 is inverted from "0" to "1". The "1" voltage is then supplied to the input of the inverter gate 16, and the output therefrom is inverted from "1" to "0". On the other hand, the "1" voltage appearing at the output of the gate 15 is also supplied to the base of the transistor 18 through the resistor 17, thus turning the transistor 18 ON.

When the transistor 18 is turned ON, the charge on the capacitor 13 is discharged through the collector and emitter of the transistor 18. The voltage at the input terminal 111 of the NAND gate 14 is decreased to substantially "0". Thereafter, the output from the NAND gate 14 is inverted from "0" to "1", and the output from the gate 15 is inverted from "1" to "0". When the output from the inverter gate 15 goes to "0", the output from the inverter gate 16 goes to "1", and the transistor 18 is cut off.

Since the transistor 18 is now cut off, the capacitor 13 stops discharging and is again charged by the photocurrent from the photodiode 11. The above operation is then repeated.

Figure 2:
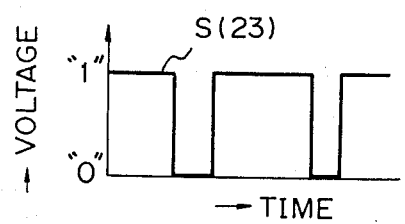
FIG. 2 is a waveform chart showing a signal waveform in the device shown in FIG. 1.

FIG. 2 shows signal waveforms in the device shown in FIG. 1. An oscillation voltage waveform, indicated by S(23) in FIG. 2, appears at the output terminal 23. In FIG. 2, the abscissa represents time, and the ordinate represents voltage.

In the above oscillation operation, in the first photodiode 11, the dark current flows from the cathode to the anode irrespective of illuminance. The dark current is influenced by an ambient temperature of the first photodiode 11 and varies in accordance therewith. Assuming that the second photodiode 12 is omitted from the above circuit, the dark current in the photodiode 11 flows into and charges the capacitor 13. The charging/discharging time of the capacitor 13 then varies in accordance with the ambient temperature, and the oscillation voltage waveform shown in FIG. 2 changes, thus undesirably changing the oscillation frequency. A conventional oscillation operation has this problem.

In the device of the present invention shown in FIG. 1, however, since the capacitor 13 is connected in parallel with the second photodiode 12, almost all of the dark current from the first photodiode 11, flows to the negative terminal 22 through the photodiode 12 and does not charge the capacitor 13. Thus, a signal having an oscillation frequency proportional to the illuminance can be obtained from the output terminal 23 without being influenced by the dark current, i.e., without being influenced by the ambient temperature.

Figure 3:
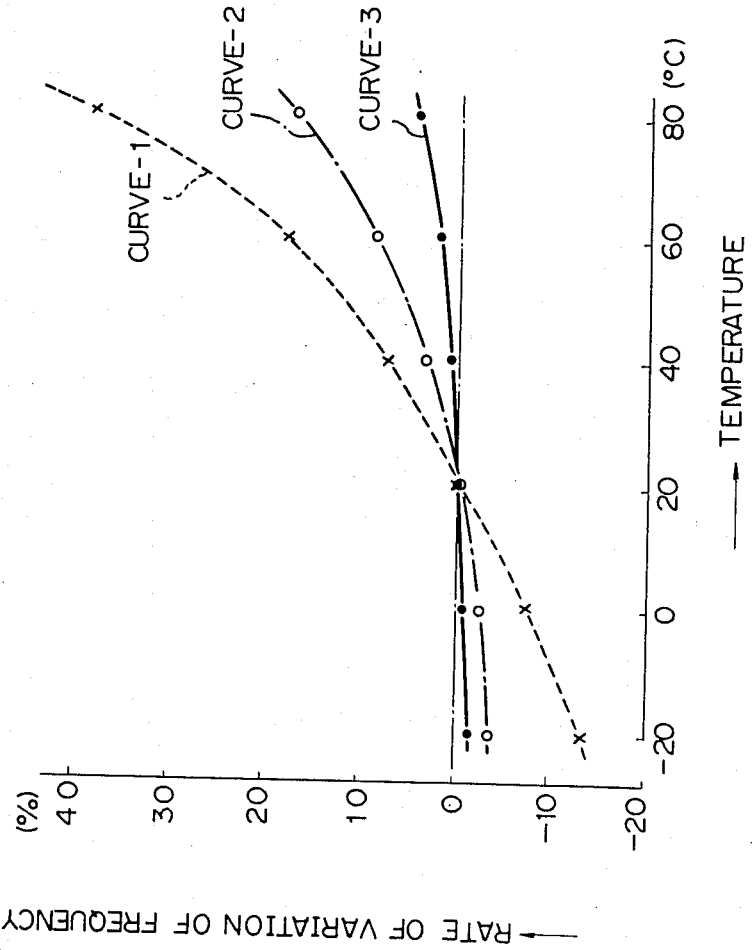
FIG. 3 is a graph showing a change in oscillation frequency with respect to temperature.

FIG. 3 shows the relationship between an ambient temperature and variations in oscillation frequency when the oscillation frequency at the ambient temperature of 20° 1 C. is given as a reference frequency. Referring to FIG. 3, the abscissa represents the ambient temperature, and the ordinate represents variations in oscillation frequency. In FIG. 3, a broken curve CURVE-1 shows the relationship in a conventional device, whereas a dotted curve CURVE-2 shows the relationship when the photodiode 12 is omitted from the device shown in FIG. 1, and a solid curve CURVE-3 shows the relationship when the photodiode 12 is provided. As can be seen from FIG. 3, an oscillation circuit according to the present invention cannot be easily influenced by ambient temperature.

Figure 4:
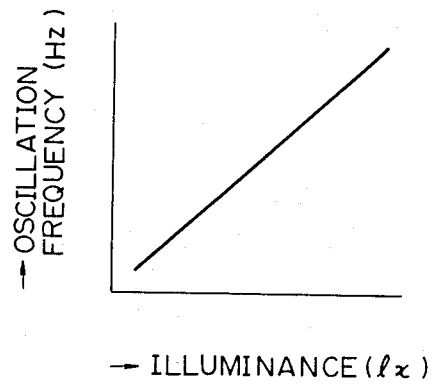
FIG. 4 is a graph showing the relationship between illuminance and an oscillation frequency in the device shown in FIG. 1.

FIG. 4 shows the relationship between illuminance and oscillation frequency. As can be seen from FIG. 4, in the device shown in FIG. 1, the oscillation frequency has linearity with respect to the illuminance.

Figure 5:
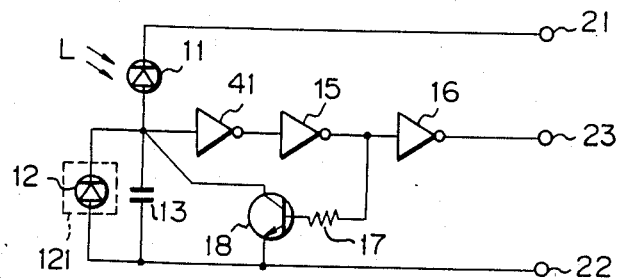
FIG. 5 is a circuit diagram showing a photo-electric conversion device according to another embodiment of the present invention.

FIG. 5 shows a photo-electric conversion device according to another embodiment of the present invention. In the device shown in FIG. 1, a change in voltage charged on the capacitor 13 by the photocurrent is detected by the NAND gate 14. However, in the device shown in FIG. 5, the change is detected by an inverter gate 41. Since the inverter gate 41 is connected in series with the inverter gate 15, if they are replaced with a non-inverter gate, the same effect can be obtained.

Figure 6:
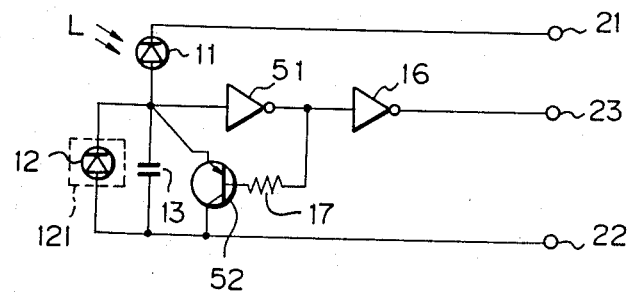
FIGS. 6 and 7 are circuit diagrams showing still other embodiments of the present invention.

For the transistor 18 of FIGS. 1 or 5, a PNP transistor 52 also can be used in place of the NPN transistor 18, as shown in FIG. 6.

Figure 7:
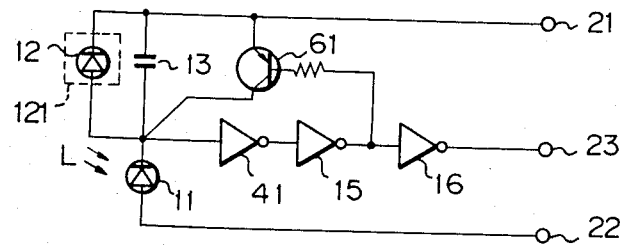

In another embodiment shown in FIG. 7, a circuit can be adapted wherein capacitor 13 is connected to a positive side 21 of the power source voltage, and a photodiode 11 is connected to a negative side 22 thereof so as to drive a PNP transistor 61 by the output from an inverter gate 15.

I claim:

1. A photo-electric conversion device for converting a light intensity into an oscillation frequency in a digital signal form, comprising:
   a first photodiode in which a current is changed in accordance with a light intensity;
   a second photodiode connected in series with said first photodiode for passing a current in the same direction as in said first photodiode;
   a light shielding structure for shielding said second photodiode with regard to light;
   a capacitor, connected in series with said first photodiode and in parallel with said second photodiode, for charging/discharging a current from said first photodiode; and
   an oscillator structure for performing a switching operation in accordance with a charging/discharging operation of said capacitor so as to generate an oscillation voltage output, wherein an electric charge which is caused by a dark current from said first photodiode flowing through said capacitor is discharged through said second photodiode such that said capacitor is always charged only by a current caused by received light detected by said first photodiode.

2. A device according to claim 1, wherein said oscillator circuit comprises a 2-input NAND gate having a Schmitt trigger function, an inverter gate, and a switching transistor.

3. A device according to claim 2, wherein said switching transistor is of an NPN type.

4. A device according to claim 2, wherein said switching transistor is of a PNP type.

5. A device according to claim 1, wherein said oscillator circuit comprises a series inverter gate circuit and a switching transistor.

6. A device according to claim 5, wherein said switching transistor is of an NPN type.

7. A device according to claim 5, wherein said switching transistor is of a PNP type.

* * * * *